United States Patent
Taguchi et al.

(10) Patent No.: US 6,849,347 B2
(45) Date of Patent: Feb. 1, 2005

(54) LIGHT-EMITTING ELEMENT USING THE POLYMER AND PROCESS FOR PRODUCING THE SAME

(75) Inventors: Toshiki Taguchi, Kanagawa (JP); Seiya Sakurai, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/237,059

(22) Filed: Sep. 9, 2002

(65) Prior Publication Data

US 2003/0124382 A1 Jul. 3, 2003

(30) Foreign Application Priority Data

Sep. 10, 2001 (JP) .................................... P. 2001-273887

(51) Int. Cl.$^7$ ......................... H05B 33/14; C09K 11/06
(52) U.S. Cl. ....................... 428/690; 428/917; 313/504; 313/506; 252/301.16; 252/301.35; 257/40
(58) Field of Search ................................ 428/690, 917; 528/244; 313/504, 506; 252/301.16, 301.35; 257/40

(56) References Cited

U.S. PATENT DOCUMENTS 5,389,444 A * 2/1995 Hosokawa et al. .......... 428/457
6,066,712 A * 5/2000 Ueda et al. .................. 528/244

FOREIGN PATENT DOCUMENTS

JP          2001-284052    * 10/2001

OTHER PUBLICATIONS

Elliott et al., "Highly Efficient Solid–State Electrochemically Generated Chemiluminescence from Ester–Substituted Trisbipyridineruthenium (II)–Based Polymers", 1998, J. of American Chemical Society, vol. 120, pp. 6781–6784.*

Toshiyuki Watanabe et al.; Organic ElectroLuminescent Materials and Devices; pp. 459–465.

Yuki EL Soshi to SonoKogyoka Saizensen, pp. 166–189; 1998.

C. W. Tang et al.; Applied Phys. Lett. vol. 51 (12), Sep. 21, 1987, pp. 913–915.

* cited by examiner

*Primary Examiner*—Rena Dye
*Assistant Examiner*—Camie S Thompson
(74) *Attorney, Agent, or Firm*—Birch, Stewart, Kolasch & Birch, LLP

(57) ABSTRACT

A light-emitting element comprising a polymer represented by the formula (1) or formula (2):

$$-(EUG)_k-(PMG)_m-(NRG)_n- \quad (1)$$

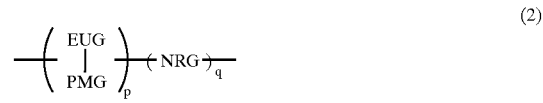

wherein EUG represents a monomer unit comprising a partial skeleton effective as a light-emitting element material; PMG represents a monomer unit comprising a polymerizable group; NRG represents a copolymerization monomer unit; (EUG-PMG) represents a group wherein PMG is bonded as a single unit of EUG; and k, m, n, p and q each represents a mole percentage wherein k is from 1 to 99(%); m is from 1 to 99(%); n is from 0 to 98(%); k+m+n=100(%); p is from 1 to 99(%); q is from 0 to 99(%); and p+q=100(%).

10 Claims, No Drawings

LIGHT-EMITTING ELEMENT USING THE POLYMER AND PROCESS FOR PRODUCING THE SAME

FIELD OF THE INVENTION

This invention relates to light-emitting elements (organic electroluminescent elements) containing a novel polymer compounds and a process for producing the light-emitting elements.

BACKGROUND OF THE INVENTION

In these days, researches and developments have been vigorously made on various indication elements. Among all, organic electroluminescence (EL) elements have attracted public attention as highly useful indication elements because of being capable of giving luminescence at a high luminance under a low voltage. For example, there have been known EL elements in which an organic thin film is formed by the vapor deposition of an organic compound (Applied Physics Letters, 51, from p. 913, (1987)). The organic EL elements reported in this document have a laminated structure made of an electron transport material and a hole transport material and show largely improved light-emitting (organic electroluminescent) characteristics compared with the conventional single-layered elements.

In such a layered element, the element is constructed by the vapor deposition of a low-molecular weight organic material as an element material. As a technique for forming a thin film as employed in organic EL elements, use can be made of various methods such as the vapor deposition method as described in the above document, the sputtering method, CVD, PVD and the coating method with the use of coating materials. These methods are described in detail in some publications such as *ORGANIC ELECTROLUMINESCENT MATERIALS AND DEVICES* (OPA, Amsterdam, 1997) and *Yuki EL Soshi* to *Sono Kogyoka Saizensen* (NTS, 1998). The present inventors have studied on a method of coating solutions of organic compounds, in particular, organic polymer materials. Organic polymer materials are characterized by capable of forming thin films with little defects as a single material and the thus formed films being excellent in physical and chemical fastness. However, it has been found out that materials obtained merely by polymerizing luminous element materials suffer from problems in light-emitting performance and durability.

SUMMARY OF THE INVENTION

An object of the present invention is to develop light-emitting element materials and light-emitting elements having a high light-emitting efficiency and a process for producing these light-emitting elements.

The present invention has been completed by the following means, i.e., polymer compounds and a process for producing the same and light-emitting element materials and light-emitting elements using these polymer compounds and a process for producing the light-emitting elements.

(1) A polymer characterized by being represented by the following formula (1) or formula (2):

 (1)

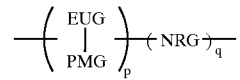 (2)

wherein EUG represents a monomer unit having a partial skeleton effective as a light-emitting element material; PMG represents a monomer unit having a polymerizable group; NRG represents a copolymerization monomer unit; (EUG-PMG) represents a group wherein PMG is bonded as a single unit of EUG; and k, m, n, p and q represent each a mole percentage (wherein k is from 1 to 99(%); m is from 1 to 99(%); n is from 0 to 98(%); k+m+n equals 100(%); p is from 1 to 99(%); q is from 0 to 99(%); and p+q equals 100(%)).

(2) A process for producing a polymer compound characterized in that a polymer compound represented by the formula (1) or the formula (2) by using a reaction wherein the polymerizable group contained in PMG is not polymerized:

 (1)

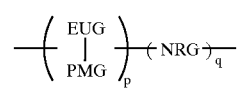 (2)

wherein EUG represents a monomer unit having a partial skeleton effective as a light-emitting element material; PMG represents a monomer unit having a polymerizable group; NRG represents a copolymerization monomer unit; (EUG-PMG) represents a group wherein PMG is bonded as a single unit of EUG; and k, m, n, p and q represent each a mole percentage (wherein k is from 1 to 99(%); m is from 1 to 99(%); n is from 0 to 98(%); k+m+n equals 100(%); p is from 1 to 99(%); q is from 0 to 99(%); and p+q equals 100(%)).

(3) A process for producing a polymer compound characterized by polymerizing a monomer unit having a polymerizable group precursor bonded thereto and post-treating the thus formed polymer to thereby form a polymerizable group in the monomer unit PMG of a polymer compound represented by the formula (1) or the formula (2):

 (1)

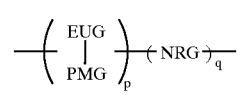 (2)

wherein EUG represents a monomer unit having a partial skeleton effective as a light-emitting element material; PMG represents a monomer unit having a polymerizable group; NRG represents a copolymerization monomer unit; (EUG-PMG) represents a group wherein PMG is bonded as a single unit of EUG; and k, m, n, p and q represent each a mole percentage (wherein k is from 1 to 99(%); m is from 1 to 99(%); n is from 0 to 98(%); k+m+n equals 100(%); p is from 1 to 99(%); q is from 0 to 99(%); and p+q equals 100(%)).

(4) A light-emitting element containing in its organic layer a polymer compound represented by the formula (1) or the formula (2) and/or a product obtained after the polymerization of a polymerizable group in the compound:

$-(EUG)_k-(PMG)_m-(NRG)_n-$      (1)

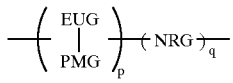
     (2)

wherein EUG represents a monomer unit having a partial skeleton effective as a light-emitting element material; PMG represents a monomer unit having a polymerizable group; NRG represents a copolymerization monomer unit; (EUG-PMG) represents a group wherein PMG is bonded as a single unit of EUG; and k, m, n, p and q represent each a mole percentage (wherein k is from 1 to 99(%); m is from 1 to 99(%); n is from 0 to 98(%); k+m+n equals 100(%); p is from 1 to 99(%); q is from 0 to 99(%); and p+q equals 100(%)).

(5) A process for producing a light-emitting element characterized by forming an organic layer of the light-emitting element as described in (4) and then inducing polymerization of the polymerizable group in a polymer compound represented by the formula (1) or the formula (2):

$-(EUG)_k-(PMG)_m-(NRG)_n-$      (1)

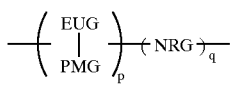
     (2)

wherein EUG represents a monomer unit having a partial skeleton effective as a light-emitting element material; PMG represents a monomer unit having a polymerizable group; NRG represents a copolymerization monomer unit; (EUG-PMG) represents a group wherein ans that PMG is bonded as a single unit of EUG; and k, m, n, p and q represent each a mole percentage (wherein k is from 1 to 99(%); m is from 1 to 99(%); n is from 0 to 98(%); k+m+n equals 100(%); p is from 1 to 99(%); q is from 0 to 99(%); and p+q equals 100(%)).

(6) A light-emitting element characterized by being represented by the formula (1) or the formula (2).

DETAILED DESCRIPTION OF THE INVENTION

The polymer represented by the formula (1) will be illustrated, firstly. In this formula, EUG represents a monomer unit having a partial skeleton effective as a light-emitting element material. As examples of the partial skeleton effective as a light-emitting element material, skeletons having hole transport properties and hole injection properties, skeletons having electron transport properties and electron injection properties, skeletons having light-emitting properties, etc. can be cited.

Typical examples of compounds having hole transport properties or hole injection properties include compounds having primary to tertiary nitrogen atoms, i.e., amine derivatives. Among all, amines substituted by aromatic hydrocarbons or heteroaromatic compounds are preferable and tertiary amines having aromatic hydrocarbons or heteroaromatic compounds as all of the substituents thereof are particularly preferable.

Next, citation may be made of heteroaromatic compounds with electron excess. Examples thereof include five-membered heteroaromatic compounds having one heteroatom in a cyclic structure and compounds composed of these heteroaromatic compounds fused to each other or to other aromatic hydrocarbons. For example, pyrrole, thiophene, furan, indole, carbazole, benzothiophene, benzofuran, dibenzothiophene, dibenzofuran, indolizine, etc. may be cited.

As hole transporter groups, moreover, use can be made of nitrogen-containing compounds such as hydrazone compounds, pyrazolone compounds, hydroxylamine compounds, alkoxyamine compounds, etc.

Among these structures, it is preferable in the present invention to use compounds containing pyrrole, thiophene, furan and aromatic and heteroaromatic condensed ring derivatives thereof. Pyrrole, thiophene and furan are compounds falling within the category of π-electron excess heteroaromatic rings and monomer units containing derivatives thereof are used in the present invention. Examples of the derivatives include benzo-fused derivatives of pyrrole, thiophene and furan (for example, indole, carbazole, benzothiophene, dibenzothiophene, benzofuran, dibenzofuran). Furthermore, indolizine, thienothiophene, thienopyrrole, isoindole, etc. may be cited.

Next, a partial structure having electron transport and injection properties will be illustrated. As groups having electron transport properties, compounds with various structures have been publicly known in the art. In particular, heteroaromatic rings are used as effective groups. First, citation may be made of nitrogen-containing five-membered heteroaromatic compounds having two or more heteroatoms. Examples thereof include pyrazole, imidazole, oxazole, thiazole, triazole (1,2,3- and 1,2,4-), tetrazole, oxadiazole (1,2,4-, 1,2,5- and 1,3,4-), thiadiazole (1,2,4-, 1,2,5- and 1,3,4-), etc. Also, use can be made of compounds wherein these compounds are fused to each other or to other aromatic hydrocarbons.

Next, citation may be made of electron-lacking nitrogen-containing six-membered heteroaromatic compounds. Examples thereof include pyridine, pyridazine, pyrimidine, triazine, etc. Similar to the above-described case, use can be also made of these compounds fused to each other or to other aromatic hydrocarbons or five-membered or six-membered heteroaromatic compounds. Examples thereof include quinazoline, quinoxaline, etc.

In the present invention, it is particularly preferable to use a partial structure having a heterocyclic derivative containing two or more hetero atoms in a cyclic system. Examples of such heterocycles include imidazole, pyrazole, pyridazine, pyrimidine, pyrazine, oxazole, thiazole, isoxazole, isothiazole, triazole, tetrazole, oxadiazole, thiadiazole, etc. and condensed rings thereof.

As a light-emitting (organic electroluminescent) partial structure, fluorescent and phosphorescent compounds may be cited. Examples thereof include various metal complexes typified by metal complexes and rare earth complexes of benzoxazole derivatives, benzoimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perynone derivatives, oxadiazole derivatives, aldazine derivatives, pyrralizine derivatives, cyclopentadiene derivatives, bis-styrylanthracene derivatives, quinacridone derivatives, pyrrolopyridine derivatives, thiadiazolopyridine derivatives, styrylamine derivatives, aromatic dimethylidene derivatives and 8-quinolyl derivatives, and polymer compounds such as polythiophene, polyphenylene and polyphenylene vinylene, etc. It is also possible to use luminoscent material skeletons showing luminescence from triplet excitions. As an example thereof, there has been reported a green light-emitting element with the use of luminescence from a iridium complex (Ir(ppy)$_3$: Tris-Ortho-Metalated Complex of iridium (III) with 2-Phenylpyridine) (Applied Physics Letters 75, 4(1999). According to the report, this element achieved an external quantum yield of 8%, i.e., exceeding 5% which had been considered as the upper limit of the external quantum yield of such elements.

Examples of the residue as a polymerizable group bonded to EUG so that EUG can serve as a monomer unit include vinyl, vinyl ether, allyl, acryl, methacryl, styryl, acetylene, butadiene, furyl and mareimide groups. Examples of ring opening-polymerizable groups include epoxy, oxetane, lactone and lactam groups, while examples of condensation-polymerizable groups include carboxylic acid derivatives, sulfonic acid derivatives, and amino, imino and ether groups.

PMG represents a monomer unit containing a polymerizable group. The term "polymerizable group" as used herein means a functional group capable of forming a polymer skeleton through polymerization. Examples of such groups include groups having a carbon-carbon multiple bond (for example, vinyl, acetylene, acryl, acrylate, acrylamide, methacryl, methacrylate, methacrylamide, arene, allyl, vinyl ether, vinylamino, furyl, pyrrole, thiophene and silol groups), groups having a small ring (for example, cyclopropyl, cyclobutyl, epoxy, oxetane, diketene and episulfide groups), and groups having a lactone group, a lactam group or a siloxane derivative. In addition to the groups as cited above, use can be also made of a combination with groups capable of forming an ester bond or an amide bond. For example, a combination of an ester group with an amino group or an ester group with a hydroxyl group may be used.

Examples of a combination of functional groups which enables the progress of a reaction under heating or at room temperature are as follows:

(a) hydroxyl group combined with epoxy group, isocyanate group, N-methyloyl group, carboxyl group, alkylhalides, acid anhydrides, acid chlorides, active ester groups (for example, sulfate), formyl group or acetal group;

(b) isocyanate group combined with hydroxyl group, mercapto group, amino group, carboxyl group or N-methylol group;

(c) carboxyl group combined with epoxy group, isocyanate group, amino group or N-methylol group;

(d) N-methylol group combined with isocyanate group, N-methylol group, carboxyl group, amino group or hydroxyl group;

(e) epoxy group combined with hydroxyl group, amino group, mercapto group, carboxyl group or N-methylol group;

(f) vinylsulfone group combined with sulfinate group or amino group;

(g) formyl group combined with hydroxyl group, mercapto group or active methylene group;

(h) mercapto group combined with formyl group, vinyl groups (allylgroup, acryl group, etc.), epoxy group, isocyanate group, N-methylol group, carboxyl group, alkyl halides, acid anhydrides, acid chlorides or active ester groups (for example, sulfate); and (i) amino group combined with formyl group, vinyl groups (allylgroup, acryl group, etc.), epoxy group, isocyanate group, N-methylol group, carboxyl group, alkyl halides, acid anhydrides, acid chlorides or active esters (for example sulfate).

Next, preferable examples of the reactive monomer will becited, though the present invention is not restricted thereto.

Namely, citation may be made of hydroxyl group-containing vinyl monomers (for example, hydroxyethyl acrylate, hydroxyethyl methacrylate, allyl alcohol, hydroxypropyl acrylate, hydroxypropyl methacrylate), isocyanate group-containing vinyl monomers (for example, isocyanatoethyl acrylate, isocyanatoethyl methacrylate), N-methylol group-containing vinyl monomers (for example, N-methylol acrylamide, N-methylol methacrylamide), epoxy group-containing vinyl monomers (for example, glycidyl acrylate, glycidyl methacrylate, allyl glycidyl ether, CYCLOMER-M100, A200 (manufactured by Daicel Chemical Industries)), carboxyl group-containing vinyl monomers (for example, acrylic acid, methacrylic acid, itaconic acid, carboxyethyl acrylate, vinyl benzoate), alkyl halide-containing vinyl monomers (for example, chloromethylstyrene, 2-hydroxy-3-chloropropyl methacrylate), acid anhydride-containing vinyl monomers (for example, maleic anhydride), formyl group-containing vinyl monomers (for example, acrolein, methacrolein), sulfinic acid-containing vinyl monomers (for example, potassium styrenesulfinate), active methylene-containing vinyl monomers (for example, acetoacetoxyethyl methacrylate) vinyl group-containing vinyl monomers (for example, allyl methacrylate, allyl acrylate), acid chloride-containing monomers (for example, acrylic acid chloride, methacrylic acid chloride) and amino group-containing monomers (for example, allylamine).

In forming a polymer containing the unit represented by PMG, it is necessary to select a polymerization method whereby the polymerizable group contained in the PMG is not polymerized. In case of containing an acrylic acid-type or methacrylic acid-type polymerizable group having anionic polymerizability and radical polymerizability, for example, it is necessary to select a polycondensation reaction or a cationic polymerization reaction in forming a polymer. In case of a polymerizable group containing a ionic polymerizable group such as epoxy group, it is necessary to select a radical polymerization reaction in forming a polymer.

As a method of introducing a polymerizable group into PMG in the present invention, a method of using a group capable of forming such a polymerizable group by a chemical reaction (i.e., a polymerizable group precursor) may be cited. In case of using the polymerizable group precursor, the monomer is polymerized and then the polymerizable group is formed by the chemical reaction of the polymer. Thus, the reaction of the polymerizable group in the PMG can be prevented in any polymerization reaction.

As examples of the polymerizable group precursor undergoing the above-described reaction, groups capable of forming a multiple bond by a β-elimination reaction, e.g., carbonyl and aryl groups having halogen atoms, sulfonyl ester, etc. at the β-position can be cited. Citation can be also made of groups capable of forming a multiple bond by a coupling reaction, for example, a coupling reaction between a formyl group and a group capable of forming a carbanion.

NRG represents a copolymerization monomer unit. In forming the polymer according to the present invention, the monomer units may be polymerized via various polymerization reactions such as vinyl polymerization, polycondensation, ring opening polymerization and aryl coupling polymerization. In the present invention, it is particularly favorable to form the polymer by polymerizing vinyl monomers. As the monomer unit NRG, vinyl polymerization monomers (for example, styrene, acrylate, methacrylate, vinyl ether, substituted allyl) are favorable.

k is an integer of 1 to 99(%). n is an integer of 0 to 98(%). k+m+n equals 100(%). It is preferable herein that k is 10(%) or more and m is 5 or more. p is an integer of 1 to 99(%). q is an integer of o to 99(%). p+q equals 100(%). It is preferable herein that p is 10(%) or more.

The monomer unit in the present invention may be substituted by various substituents other than those serving as a ballast group. Examples of the substituents are as follows: halogen atoms (for example, fluorine, chlorine, bromine, iodine), cyano group, formyl group, substituted or unsubstituted alkyl groups (preferably having 1 to 30 carbon atoms, still preferably having 1 to 15 carbon atoms, for example, methyl, t-butyl, cyclohexyl), alkenyl groups (preferably having 2 to 30 carbon atoms, still preferably having 2 to 15 carbon atoms, for example, vinyl, 1-propenyl, 1-buten-2-yl, cyclohexen-1-yl), alkynyl groups (preferably having 2 to 30 carbon atoms, still preferably having 2 to 15 carbon atoms, for example, ethynyl, 1-propynyl), aryl groups (preferably having 6 to 30 carbon atoms, still preferably having 6 to 15 carbon atoms, for example, phenyl, tolyl, xylyl, naphthyl, biphenylyl, pyrenyl), heterocyclic groups (preferably five- or six-membered cycles optionally fused to other ring(s); examples of heteroatom including nitrogen, oxygen and sulfur; preferably having 2 to 30 carbon atoms, still preferably having 2 to 15 carbon atoms, for example, pyridyl, piperidy, oxazolyl, oxadiazolyl, tetrahydrofuryl, thienyl), primary to tertiary amino groups (for example, amino, alkylamino, arylamino, dialkylamino, diarylamino, alkylarylamino, heterocyclic amino, bisheterocyclic amino; preferably having 1 to 30 carbon atoms, still preferably having 1 to 16 carbon atoms, for example, dimethylamino, diphenylamino, phenylnaphthylamino), imino groups (groups represented by $-CR^{11}=NR^{12}$ or $-N=CR^{13}R^{14}$, wherein $R^{11}$ to $R^{14}$ are each selected from among hydrogen, alkyl, aryl, heterocycle, alkoxy, aryloxy and primary to tertiary amino, preferably having 1 to 30 carbon atoms, still preferably having 6 to 15 carbon atoms) and alkoxy groups (preferably having 1 to 30 carbon atoms, still preferably having 6 to 15 carbon atoms; for example, methoxy, ethoxy, cyclohexyloxy), aryloxy groups (preferably having 6 to 30 carbon atoms, still preferably having 6 to 15 carbon atoms, for example, phenoxy, 1-naphthoxy, 4-phenylphenoxy), alkylthio groups (preferably having 1 to 30 carbon atoms, still preferably having 1 to 15 carbon atoms, for example, methylthio, ethylthio, cyclohexylthio), arylthio groups (preferably having 6 to 30 carbon atoms, still preferably having 6 to 15 carbon atoms, for example, phenylthio, tolylthio), carbonamido groups (preferably having 1 to 30 carbon atoms, still preferably having 1 to 15 carbon atoms, for example, acetamido, benzoylamido, N-methylbenzoylamido), sulfonamido groups (preferably having 1 to 30 carbon atoms, still preferably having 1 to 15 carbon atoms, for example, methanesulfonamido, benzenesulfonamido, p-toluenesulfonamido), carbamoyl groups (preferably having 1 to 30 carbon atoms, still preferably having 1 to 15 carbon atoms, for example, unsubstituted carbamoyl, methylcarbamoyl, dimethylcarbamoyl, phenylcarbamoyl, diphenylcarbamoyl, dioctylcarbamoyl), sulfamoyl groups (preferably having 0 to 30 carbon atoms, still preferably having 0 to 15 carbon atoms, for example, unsubstituted sulfamoyl, methylsulfamoyl, dimethylsulfamoyl, phenylsulfamoyl, diphenylsulfamoyl, dioctylsulfamoyl), alkylcarbonyl groups (preferably having 2 to 30 carbon atoms, still preferably having 2 to 15 carbon atoms, for example, acetyl, propionyl, butyroyl, lauroyl), arylcarbonyl groups (preferably having 7 to 30 carbon atoms, still preferably having 7 to 15 carbon atoms, for example, benzoyl, naphthoyl), alkylsulfonyl groups (preferably having 1 to 30 carbon atoms, still preferably having 1 to 15 carbon atoms, for example, methanesulfonyl, ethanesulfonyl), arylsulfonyl groups (preferably having 6 to 30 carbon atoms, still preferably having 6 to 15 carbon atoms, for example, benzenesulfonyl, p-toluenesulfonyl, 1-naphthalenesulfonyl) alkoxycarbonyl (preferably having 2 to 30 carbon atoms, still preferably having 2 to 15 carbon atoms, for example, methoxycarbonyl, ethoxycarbonyl, butoxycarbonyl), aryloxycarbonyl groups (preferably having 7 to 30 carbon atoms, still preferably having 7 to 15 carbon atoms, for example, phenoxycarbonyl, 1-naphthoxycarbonyl), alkylcarbonyloxy groups (preferably having 2 to 30 carbon atoms, still preferably having 2 to 15 carbon atoms, for example, acetoxy, propionyloxy, butyroyloxy), arylcarbonyloxy groups (preferably having 7 to 30 carbon atoms, still preferably having 7 to 15 carbon atoms, for example, benzoyloxy, 1-naphthoyloxy), urethane groups (preferably having 2 to 30 carbon atoms, still preferably having 2 to 15 carbon atoms, for example, methoxycarbonamido, phenoxycarbonamido, methylaminocarbonamido), ureido groups (preferably having 1 to 30 carbon atoms, still preferably having 1 to 15 carbon atoms, for example, methylaminocarbonamido, dimethylaminocarbonamido, diphenylaminocarbonamido) and carbonic acid ester groups (preferably having 2 to 30 carbon atoms, still preferably having 2 to 15 carbon atoms, for example, methoxycarbonyloxy, phenoxycarbonyloxy).

Next, the polymer represented by the formula (2) will be illustrated. In the formula (2), the monomer units represented by EUG, PMG and NRG are each the same as defined concerning the polymer represented by the formula (1).

In formula (2), (EUG-PMG) represents a group wherein PMG is bonded as a single unit of EUG. p and q each represents a mole percentage provided that p+q equals 100(%).

Preferably, a polymer represented by the formula (1) or formula (2) is a combination of monomers as following (A) to (C):

(A) EUG which represents a monomer unit comprising a partial skeleton selected from the group consisting of pyrrole, thiophene, furan and aromatic, heteroaromatic condensed ring compounds thereof, and a nitrogen-containing five-membered heteroaromatic compound comprising two or more heteroatoms;

(B) PMG which represents a monomer unit comprising a polymerizable group selected from a group having a carbon-carbon multiple bond, an epoxy group, and an oxetane group; and (C) NRG which represents a monomer unit having a vinyl group Next, specific examples of preferable monomer units and specific examples of reactions for synthesizing the same will be provided. However, it is needless to say that the present invention is not restricted thereto.

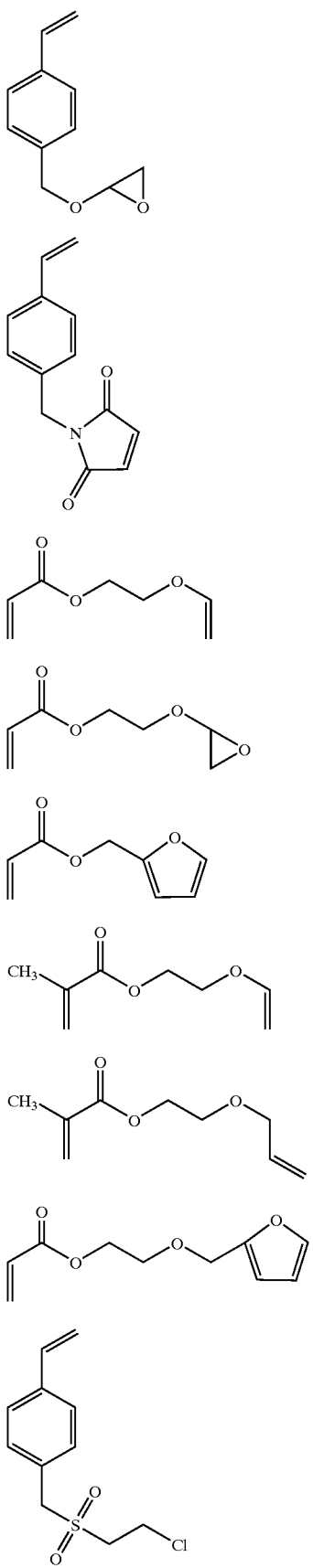
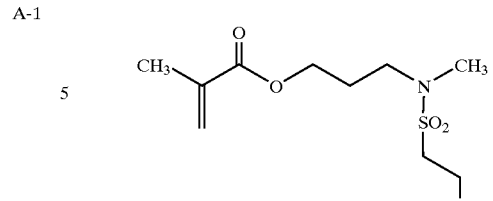
A-1
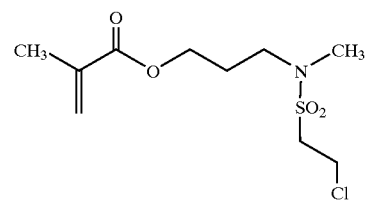
A-10
A-2
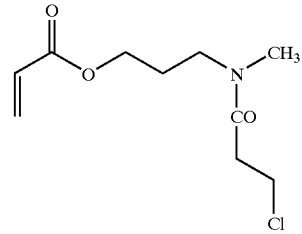
A-11
A-3
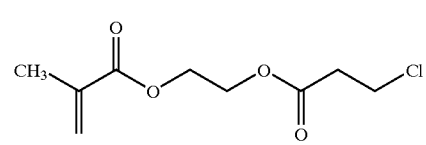
A-12
A-4
A-5
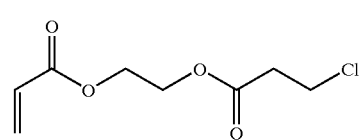
A-13
A-6
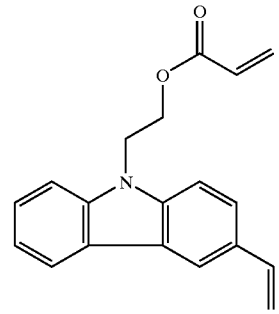
A-14
A-7
A-8
A-9
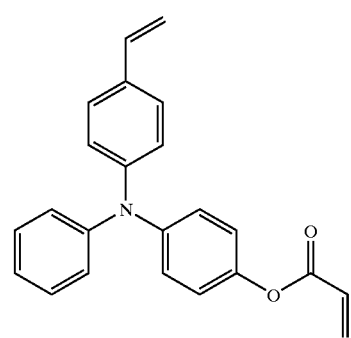
A-15

The following chemical formula shows a specific method for synthesizing these monomers.

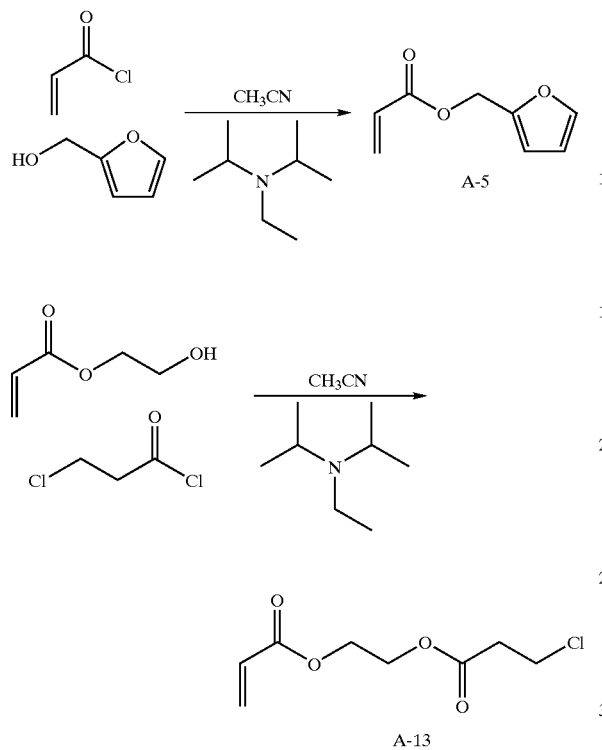

1) Synthesis of Monomer (A-13)

A 1000 ml three-necked flask provided with a thermometer and a reflux condenser was cooled with an ice-bath and then 300 ml of acetonitrile, 39 g (0.3 mol) of diisopropylethylamine and 34.9 g (0.3 mol) of hydroxyethyl acrylate were fed thereinto. Under stirring the contents with a magnetic stirrer, 38.1 g (0.3 mol) of 3-chloropropionyl chloride was slowly dropped thereinto so that the internal temperature would not exceed 20° C. After the completion of the addition, the mixture was stirred at room temperature for 1 hour and the reaction mixture was poured into a solvent mixture of diluted hydrochloric acid with ethyl acetate. Then it was separated by shaking in a separation funnel and the aqueous phase was discharged. The ethyl acetate phase was further washed with water and an aqueous sodium chloride solution, dried over anhydrous magnesium sulfate and filtered. Then ethyl acetate was distilled off under reduced pressure with an evaporator. The oily substance thus obtained was fractionated and purified by silica gel chromatography with the use of a solvent mixture of n-hexane/ethyl acetate (5/1). Thus 52 g of a monomer A-13 was obtained as an oily substance.

2) Synthesis of Monomer (A-5)

A 1000 ml three-necked flask provided with a thermometer and a reflux condenser was cooled with an ice-bath and then 300 ml of acetonitrile, 39 g (0.3 mol) of diisopropylethylamine and 29.4 g (0.3 mol) of furfuryl alcohol were fed thereinto. Under stirring the contents with a magnetic stirrer, 28.5 g (0.3 mol) of acrylic acid chloride was slowly dropped thereinto so that the internal temperature would not exceed 20° C. After the completion of the addition, the mixture was stirred at room temperature for 1 hour and the reaction mixture was poured into a solvent mixture of water with ethyl acetate. Then it was separated by shaking in a separation funnel and the aqueous phase was discharged. The ethyl acetate phase was further washed with water and an aqueous sodium chloride solution, dried over anhydrous magnesium sulfate and filtered. Then ethyl acetate was distilled off under reduced pressure with an evaporator. The oily substance thus obtained was fractionated and purified by alumina chromatography with the use of a solvent mixture of n-hexane/ethylacetate(10/1). Thus 27 g of a monomer A-5 was obtained as an oily substance.

Furthermore, specific examples of the polymer compounds formed by the above-described polymerization reactions of the monomers (polymers preferably usable in the present invention) will be given. However, it is needless to say that the present invention is not restricted to these examples.

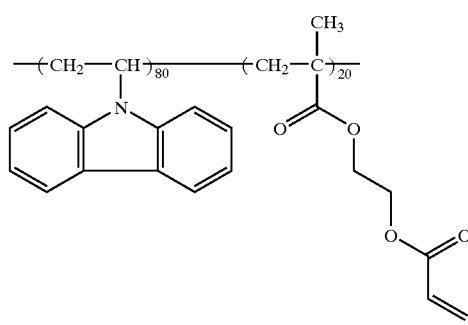

P-1

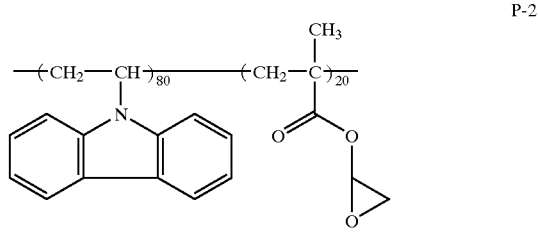

P-2

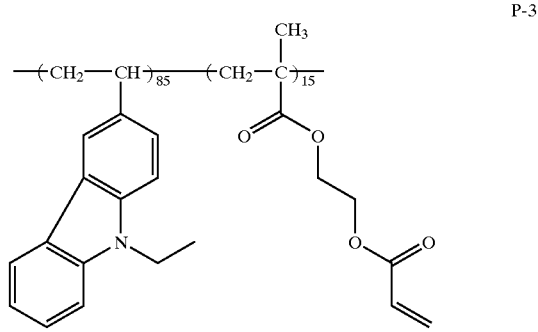

P-3

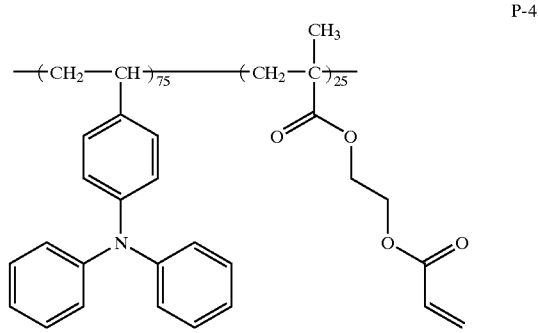

P-4

P-5
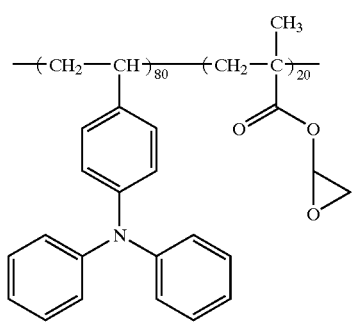
P-6
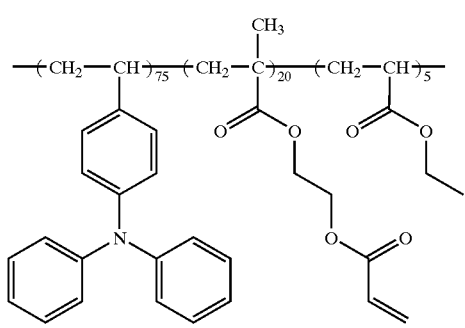
P-7
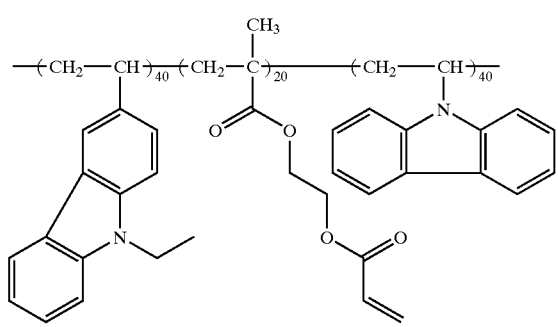
P-8
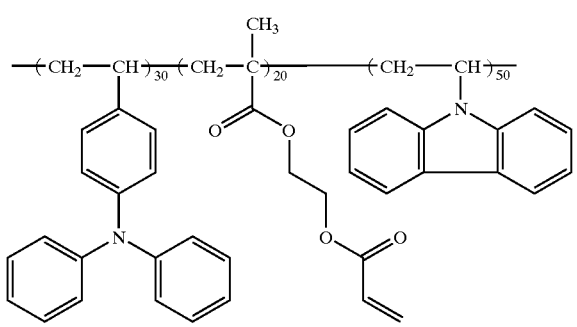
P-9
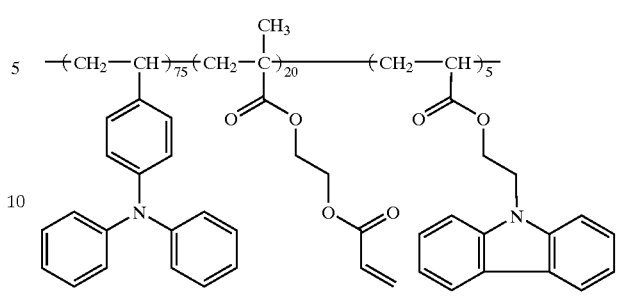
P-10
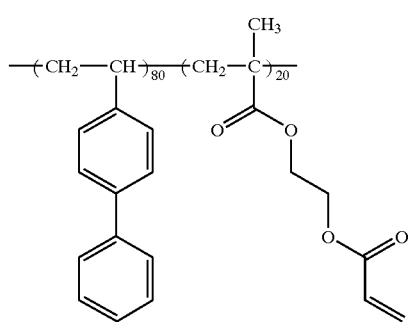
P-11
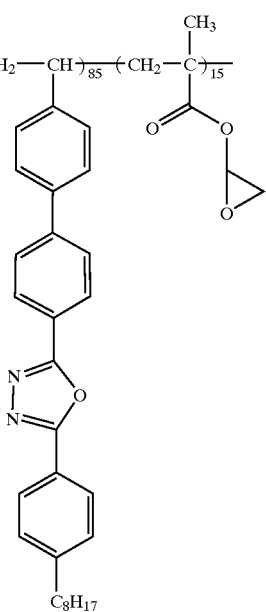

P-12

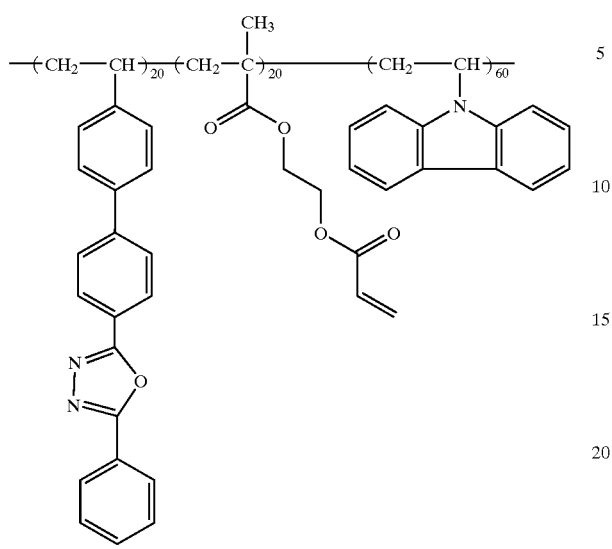

P-13

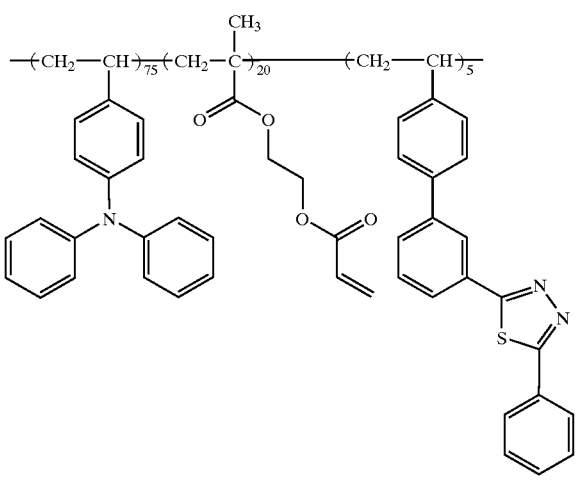

The following chemical formula shows a specific method for synthesizing the polymers.

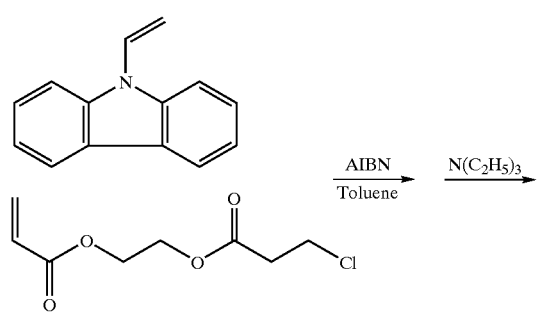

P-1

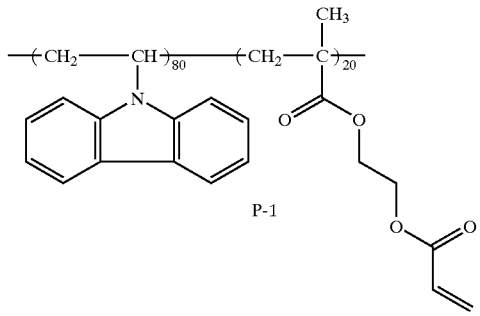

Synthesis of Polymer (P-1)

Into a 500 ml three-necked flask provided with a thermometer, a gas inlet tube and a reflux condenser were fee 16.7 g of N-vinyl carbazole, 3.4 g of Monomer A-13 and 200 ml of toluene and a nitrogen gas stream was bubbled thereinto. Under stirring the contents with a magnetic stirrer, the internal temperature was controlled to 75° C. As an initiator, azoisobutyronitrile (AIBN) was added thereto in 0.1 g five times at intervals of 1 hour. After the completion of the addition, the polymerization reaction was continued for additional 3 hours. Thus, it was confirmed by examining with a TLC plate that the monomer had all disappeared. After the completion of the polymerization reaction, 20 ml of triethylamine was added to the polymer solution and the mixture was stirred at room temperature for additional 24 hours. Thus, triethylamine hydrochloride was precipitated. This polymer solution was poured into 5 l of methanol and the polymer was purified by precipitation. The polymer thus precipitated was collected by filtration and dried. Thus 17.8 g of a polymer P-1 was obtained as a flaky solid. As the results of the GPC analysis by using THF as a solvent, it was found out that the average molecular weight (Mw) of this polymer was 29000.

The polymers in the present invention can be derived into polymers by polymerization methods such as radical polymerization, ionic polymerization, polycondensation and ring opening polymerization. Among all, it is favorable to use polymers obtained by vinyl polymerization such as radical polymerization or ionic polymerization. These polymerization methods are described in detail in *Kobunshi Gosei no Jikkenho*, Otsu and Kinoshita, Kagaku-Dojin (1972). The average molecular weight (Mw) of the thus synthesized polymers ranges from 1,000 to $1\times10^7$, preferably from 2,000 to $1\times10^6$, still preferably from 5,000 to $5\times10^5$. The polymers according to the present invention are usable as light-emitting element materials. Such a polymer may be used as a light-emitting element material either alone or combinedly with other organic materials or inorganic materials. The organic materials to be used together may be low-molecular weight organic materials. The polymers according to the present invention are usable as any of hole injection materials, hole transport materials, light-emitting (organic electroluminescent) materials, electron transport materials and electron injection materials.

The polymer to be used in the present invention may be used either alone or as a mixture with other polymer(s). Moreover, it can be used as a mixture with low-molecular weight compound(s).

In case of using the polymer the present invention as a light-emitting element material, the polymer is applied and then allowed to undergo polymerization. Thus, the element material in the form of a thin film thus applied can be denatured and its functions as a light-emitting element material can be improved.

Now, the polymerization mechanism of the compound according to the present invention in a light-emitting element will be illustrated. In case where reactive groups react with each other to form chemical bonds, the bonds may be formed either in the solution prior to the formation of the element or in the course of the formation of the element. Alternatively, the groups may be slowly react with each other in the film or between films adjacent together to thereby form the bonds after the formation of the element. In case where the reaction arises during or after the formation of the element, external energy (heat, light, ultrasonic wave, etc.) may be supplied. Alternatively, the reaction may be spontaneously performed at room temperature. Furthermore, the reaction maybe accelerated by an electric current supplied at driving or light or heat thus evolved.

As the above-described reaction, use can be made of various reactions such as a condensation reaction whereby ester bonds or amide bonds are formed, a vinyl polymerization reaction whereby unsaturated bonds are polymerized and a cyclic reaction (2+2 photoreaction, Diels-Alder reaction, etc.) proceeding between unsaturated bonds.

In the light-emitting element according to the present invention, the compound represented by the formula (1) and/or the formula (2) is used in the organic layer (i.e., the light-emitting layer or a plural number of organic layers including the light-emitting layer) in an amount of 0.01% by weight or more but not more than 100% by weight, still preferably 0.01% by weight or more but not more than 95% by weight and further preferably 1% by weight or more but not more than 90% by weight.

In the present invention, various methods can be used as a method of further inducing a polymerization reaction of the groups contained in PMG in the applied polymer. Specific examples thereof are as follows. Examples of physical methods include a method of inducing a photochemical reaction due to ultraviolet light or visible light, a method of inducing a reaction by heat and a method of performing ultrasonication. Examples of chemical methods include denaturation of polymer functions by treating with acid salts or adding low-molecular weight organic materials. Among all, physical post-treatments are preferable and heat post-treatment is still preferable.

Next, the light-emitting element containing the compound according to the present invention will be illustrated. The organic layer of the light-emitting element containing the compound according to the present invention may be formed by, for example, the resistance heating vapor deposition method, the electron beam method, the sputtering method, the molecular lamination method, the coating method, the ink jet method, the printing method or the transfer method, though the present invention is not restricted thereto. From the viewpoints of characteristics and production, it is preferable to use the resistance heating vapor deposition method or the coating method.

The light-emitting element according to the present invention is an element wherein a light-emitting layer or a plural number of organic compound layers including the light-emitting layer are formed between a pair of electrodes, i.e., an anode and a cathode. In addition to the light-emitting layer, it may have a hole injection layer, a hole transport layer, an electron injection layer, an electron transport layer, a protective layer, and so on. Each of these layers may have other functions. These layers maybe formed by using respective materials.

The anode, which supplies holes to the hole injection layer, the hole transport layer, the light-emitting layer, etc., may be made of metals, alloys, metal oxides, electrical conductive compounds or mixtures thereof. It is preferable to use a material having a work function of 4 eV or more. Specific examples thereof include electrical conductive metal oxides such as tin oxide, zinc oxide, indium oxide and indium tin oxide (ITO), metals such as gold, silver, chromium and nickel, mixtures or laminations of these metals with electrical conductive metal oxides, inorganic electrical conductive materials such as copper iodide and copper sulfide, organic electrical conductive materials such as polyaniline, polythiophene and polypyrrole, and laminations thereof with ITO. It is preferable to use electrically conductive metal oxides, still preferably ITO from the viewpoints of productivity, high electrical conductivity, transparency, etc. The film thickness of the anode may be appropriately selected depending on the material employed. In usual, it preferably ranges from 10 nm to 5 $\mu$m, still preferably from 50 nm to 1 $\mu$m and further preferably from 100 nm to 500 nm.

The anode is usually constructed by forming layers on a substrate made of soda lime glass, alkali-free glass, transparent resin, etc. In case of using glass,it is favorable to use an alkali-free glass material so as to minimize the elution of ions from the glass. In case of using soda lime glass, it is favorable to form a barrier coating made of silica, etc. The thickness of the substrate is not particularly restricted, so long as the mechanical strength can be maintained at the required level. In case of using glass, the substrate thickness is usually 0.2 mm or more, preferably 0.7 mm or more. The anode can be constructed by various methods depending on the material employed. In case of using ITO, for example, a film may be formed by the electron beam method, the sputtering method, the resistance heating vapor deposition method, the chemical reaction method (for example, the sol-gel method), or the method of applying an indium tin oxide dispersion. The anode may be subjected to washing or other treatments so as to lower the driving voltage of the element or enhance the light-emitting efficiency. In case of using ITO, for example, it is effective to use UV-ozone treatment, plasma treatment, etc.

The cathode, which supplies electrons to the electron injection layer, the electron transport layer, the light-emitting layer, etc., is selected by considering adhesiveness to layers adjacent to the negative electrode (for example, the electron injection layer, the electron transport layer, the light-emitting layer), ionization potential, stability and so on. As the material of the cathode, use can be made of metals, alloys, metal halides, metal oxides, electrical conductive compounds or mixtures thereof. Specific examples include alkali metals (for example, LI, Na, K, Cs) and fluorides thereof, alkaline earth metals (for example, Mg, Ca) and fluorides thereof, gold, silver, lead, aluminum, sodium-potassium alloy and mixtures of these metals, lithium-aluminum alloy and mixtures of these metals, magnesium-solver alloy and mixtures of these metals, and rare earth metals such as indium and ytterbium. It is preferable to use a material having a work function of 4 eV or less, still preferably aluminum, lithium-aluminum alloy or a mixture of these metals, magnesium-silver alloy or a mixture of these metals, etc. The cathode may have not only a single-layer structure made of the above-described compound and mixture but also a layered structure containing the above-described compound and mixture. The film thickness of the cathode maybe appropriately selected depending on the material employed. In usual, it preferably ranges from 10 nm to 5 µm, still preferably from 50 nm to 1 µm and further preferably from 100 nm to 1 µm. The cathode may be constructed by, for example, the electron beam method, the sputtering method, the resistance heating method or the coating method. It is possible to vapor-deposit either a single metal or two or more components simultaneously. It is also possible to simultaneously vapor-deposit a plural number of metals to form an alloy electrode. Alternatively, an alloy may be preliminarily prepared and then subjected to vapor-deposition. It is favorable that the anode and the cathode have low sheet resistances, i.e., several hundreds Ω/□ (square) or less.

The light-emitting layer may be made of any material, so long as it is capable of forming a layer having the functions of enabling the injection of holes from the anode or the hole injection layer and the hole transport layer and, at the same time, injection of electrons from the cathode or the electron injection layer and the electron transport layer at the application of electric field, the function of transporting the thus injected charges and the function of allowing the re-binding of holes to electrons for the luminescence. Although it is preferable that the light-emitting layer contains the polymer (amine) compound according to the present invention, it is also possible to use other light-emitting materials, for example, metal complexes of benzoxazole derivatives, benzoimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perynone derivatives, oxadiazole derivatives, aldazine derivatives, pyrralizine derivatives, cyclopentadiene derivatives, bisstyrylanthracene derivatives, quinacridone derivatives, pyrrolopyridine derivatives, thiadiazolopyridine derivatives, cyclopentadiene styrylamine derivatives, aromatic dimethylidene derivatives and 8-quinolyl derivatives, and polymer compounds such as polythiophene, polyphenylene and polyphenylene vinylene, etc. The film thickness of the light-emitting layer is not particularly restricted but preferably ranges from 1 nm to 5 µm, still preferably from 5 nm to 1 µm and further preferably from 10 nm to 500 nm.

The light-emitting layer may be formed by, for example, the resistance heating method, the electron beam method, the sputtering method, the molecular lamination method, the coating method (spin coating, casting, dip coating, etc.), the LB method, the ink jet method, the printing method or method or the transfer method, though the present invention is not restricted thereto.

The light-emitting layer may have either a single-layer structure made of one or more of the above-described materials or a multilayer structure consisting of a plural number of layers of the same or different compositions.

The hole injection layer and the hole transport layer maybe made of any materials, so long as having one of the functions of injecting holes from the anode, transporting holes and blocking electrons injected from the cathode. Specific examples thereof include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, porphyrin compounds, polysilane compounds, poly(N-vinylcarbazole) derivatives, aniline copolymers, electrical conductive thiophene oligomers such as thiophene oligomers and polythiophene. Although the hole injection layer and the hole transport later are not restricted in film thickness, it preferably ranges from 1 nm to 5 µm, still preferably from 5 nm to 1 µm and further preferably from 10 nm to 500 nm. The hole injection layer and the hole transport layer may each have either a single-layer structure made of one or more of the above-described materials or a multilayer structure consisting of a plural number of layers of the same or different compositions.

The hole injection layer and the hole transport layer may be formed by using, for example, the vacuum vapor deposition method, the LB method, the ink jet method or a method of dissolving or dispersing the above-described hole injection/transport component in a solvent followed by coating (spin coating, casting, dip coating, etc.). In case of the coating method, the hole injection/transport component can be dissolved or dispersed together with a resin component. Examples of the resin component include polyvinyl chloride, polycarbonate, polystyrene, polymethylmethacrylate, polybutylmethacrylate, polyester, polysulfone, polyphenylene oxide, polybutadiene, poly(n-vinylcarbazole), hydrocarbon resins, ketone resins, phenoxy resins, polyamide, ethylcellulose, vinyl acetate, ABS resins, polyurethane, melamine resins, unsaturated polyester resins, alkyd resins, epoxy resins and silicone resins.

The electron injection layer and the electron transport layer may be made of any materials, so long as having one of the functions of injecting electrons from the cathode, transporting electrons and blocking holes injected from the anode. Specific examples thereof include various metal complexes typified by metal complexes of triazole derivatives, oxazole derivatives, oxadiazole derivatives, fluorenone derivatives, anthraquinodimethane derivatives, anthrone derivatives, diphenylquinone derivatives, thiopyran dioxide derivatives, carbidiimide derivatives, fluorenylidenemethane derivatives, distyrylpyrazine derivatives, heterocyclic tetracarboxylic acid anhydrides such as naphthaleneperylene derivatives, phthalocyanine derivatives and 8-quinolinol and metal complexes having metal phthalocyanine, benzoxazole and benzothiazole as a ligand. Although the electron injection layer and the electron transport later are not restricted in film thickness, it preferably ranges from 1 nm to 5 µm, still preferably from 5 nm to 1 µm and further preferably from 10 nm to 500 nm. The electron injection layer and the electron transport layer may each have either a single-layer structure made of one or more of the above-described materials or a multilayer structure consisting of a plural number of layers of the same or different compositions.

The electron injection layer and the electron transport layer may be formed by using, for example, the vacuum vapor deposition method, the LB method, the ink jet method or a method of dissolving or dispersing the above-described electron injection/transport component in a solvent followed by coating (spin coating, casting, dip coating, etc.). In case of the coating method, the electron injection/transport component can be dissolved or dispersed together with a resin component. As the resin component, use can be made of, for example, those cited in the case of the hole injection/transport layers.

The protective layer may be made of any material so long as it has a function of preventing the invasion of substances causing deterioration of the element, for example, moisture and oxygen. Specific examples thereof include metals such as In, Sn, Pb, AU, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, nitrides such as $SiN_x$ and $SiN_xO_y$, metal fluorides such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, chlorotrifluoroethylene/dichlorodifluoroethylene copolymer, copolymers obtained by copolymerizing a monomer mixture containing tetrafluoroethylene with at least one comonomer, fluorine-containing copolymers having a cyclic structure in the main copolymer chain, water-absorbing materials having a water absorption of 1% or more and moisture-proof substances having a water absorption of 0.1% or less.

The protective layer may be formed by any methods without restriction, for example, the vacuum vapor deposition method, the sputtering method, the reactive sputtering method, the MBE (molecular beam epitaxy) method, the cluster ion beam method, the ion plating method, the plasma polymerization method (high-frequency excitation ion plating method), the plasma CVD method, the laser CVD method, the heat CVD method, the gas source CVD method, the coating method, the ink jet method, the printing method or the transfer method.

EXAMPLES

The present invention will be described in greater detail by reference to the following examples. However, it is to be understood that the scope of the present invention is not restricted thereto.
(Examples)

An ITO film of 150 nm in thickness was formed on a glass substrate (25 mm×25 mm×0.7 mm) to give a transparent support substrate. This transparent support substrate was etched and washed. Then the substrate was spin-coated with a dispersion of poly [(3,4-ethylenedioxy)-2,5-thiophene] polystyrenesulfonate (Baytron P manufactured by Bayer, solid content: 1.3%). Next, a light-emitting layer was formed thereon by spin-coating 40 mg of poly (N-vinylcarbazole (PVK)), 12 mg of PBD (2-(4'-t-butylphenyl)-5-(4"-(phenyl)phenyl)-1,3,4-oxadiazole and 61 mg of coumarin employed as a light-emitting material dissolved in 2 ml of 1,2-dichloroethane. Subsequently, the product was vacuum-dried at 150° C. for 2 hours to form a coating layer of 100 nm in thickness. This coating film has a thickness of about 80 nm. Further, a solution of 1.0 g of the compound E-1 dissolved in 5 ml of n-butanol was spin-coated thereon. The film thickness of the finally formed coating film was about 120 nm. A mask having this element patterned on an organic thin film (i.e., a mask having a light-emitting area of 5 mm×5 mm) was provided and magnesium:silver (10:1) were vapor-deposited together at 250 nm in a vapor deposition apparatus followed by the vapor deposition of 300 nm of silver, thereby constructing an element 101. The light-emitting characteristics of this element were examined by applying a direct current constant voltage on the EL element by using a Source Measurer Unit Model 2400 (manufactured by Toyo Technica) and measuring the luminance and the light-emitting wavelength of the luminescence thus induced respectively with a Luminance MeterModel BM-8 (manufactured by Topcon) and a Spectrum Analyzer PMA-11 (manufactured by Hamamatsu Photonics). When applied a voltage of 19V, the element 101 showed a luminance of 400 cd/m². The maximum luminance (Lmax) achieved by further elevating the voltage was 1100 cd/m². The light-emitting spectrum was measured and the light-emitting energy over the whole spectrum region was integrated. Based on the ratio of the value thus obtained to the input energy, the external quantum efficiency was evaluated. As a result, the maximum light-emitting external quantum efficiency (Qexmax) was 0.25%.

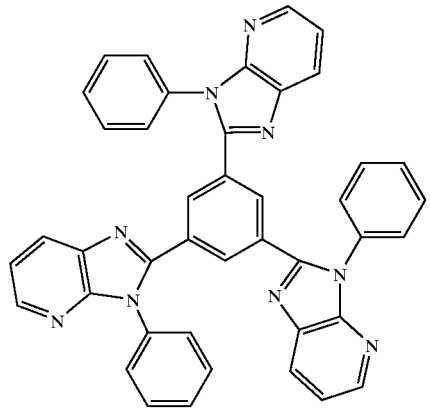

E-1

Elements 102 to 110 having the same element constitution as the element 101 but using the materials according to the present invention in the light-emitting layer as listed in Table 1 were constructed. Table 2 shows the results of the evaluation of the light-emitting characteristics of these elements.

TABLE 1

TL-1                                    Q-1

| Element No. | Light-emitting material | Other materials |
|---|---|---|
| 101 (comparison) | coumarin-6 1 mg | PVK 40 mg, PBD 12 mg |
| 102 (comparison) | coumarin-6 1 mg | Q-1 40 mg, PBD 12 mg |
| 103 (invention) | coumarin-6 1 mg | P-1 40 mg, PBD 12 mg |
| 104 (invention) | coumarin-6 1 mg | P-3 40 mg, PBD 12 mg |
| 105 (comparison) | TL-1 1 mg | PVK 40 mg, PBD 12 mg |
| 106 (comparison) | TL-1 1 mg | Q-1 40 mg, PBD 12 mg |
| 107 (invention) | TL-1 1 mg | P-1 40 mg, PBD 12 mg |
| 108 (invention) | TL-1 1 mg | P-3 40 mg, PBD 12 mg |
| 109 (invention) | TL-1 1 mg | P-1 20 mg, P-3 20 mg, PBD 12 mg |
| 110 (invention) | TL-l 1 mg | P-7 40 mg, PBD 12 mg |

TABLE 2

| Element No. | Lmax | Qexmax |
|---|---|---|
| 101 (comparison) | 1100 cd/m² | 0.25% |
| 102 (comparison) | 1300 cd/m² | 0.27% |
| 103 (invention) | 7500 cd/m² | 1.7% |

TABLE 2-continued

| Element No. | Lmax | Qexmax |
|---|---|---|
| 104 (invention) | 7800 cd/m$^2$ | 1.8% |
| 105 (comparison) | 3200 cd/m$^2$ | 0.75% |
| 106 (comparison) | 3300 cd/m$^2$ | 0.75% |
| 107 (invention) | 52000 cd/m$^2$ | 13% |
| 108 (invention) | 49000 cd/m$^2$ | 12% |
| 109 (invention) | 48000 cd/m$^2$ | 12% |
| 110 (invention) | 54000 cd/m$^2$ | 13% |

Thus, it can be understood that the elements with the use of the compounds according to the present invention are highly superior to the elements of the comparative examples in light-emitting performance in the layered structure. This effect was also observed in elements with the use of light-emitting materials showing luminescence from triplet excitions.

According to the present invention, novel polymer compounds, a process for producing the same, light-emitting element materials and light-emitting elements with the use of these polymer compounds showing a high light-emitting efficiency and a process for producing the light-emitting elements have been developed.

This application is based on Japanese Patent application JP 2001-273887, filed Sep. 10, 2001, the entire content of which is hereby incorporated by reference, the same as if set forth at length.

What is claimed is:

1. An organic electroluminescent element comprising a pair of electrodes and at least one organic layer including a luminescent layer, the organic layer comprising at least one of:

a polymer compound represented by the formula (1) or the formula (2):

(1)

(2)

wherein EUG represents a monomer unit comprising a partial skeleton; PMG represents a monomer unit comprising a polymerizable group and the polymerizable group of PMG is in a terminal of the side chain of the PMG in formula (1); NRG represents a copolymerization monomer unit; (EUG-PMG) represents a group wherein PMG is bonded as a single unit of EUG; and k, m, n, p and q each represents a mole percentage wherein k is from 1 to 99(%); m is from 1 to 99(%); n is from 0 to 98(%); k+m+n=100(%); p is from 1 to 99(%); q is from 0 to 99(%); and p+q=100(%); and a product obtained after a polymerization of the polymerizable group.

2. The organic electroluminescent element of claim 1, wherein k is from 10 to 99(%).

3. The organic electroluminescent element of claim 1, wherein the partial skeleton is pyrrole, thiophene, furan, or aromatic or heteroaromatic condensed ring compounds thereof.

4. The organic electroluminescent element of claim 1, wherein the copolymerization monomer unit represented by NRG is a vinyl polymerization monomer.

5. The organic electroluminescent element of claim 1, wherein the polymerizable group is a group having a carbon—carbon multiple bond, an epoxy group, or an oxetane group.

6. The organic electroluminescent element of claim 1, wherein

EUG represents a monomer unit comprising a partial skeleton selected from the group consisting of pyrrole, thiophene, furan and aromatic, heteroaromatic condensed ring compounds thereof, and a nitrogen-containing five-membered heteroaromatic compound comprising two or more heteroatoms;

PMG represents a monomer unit comprising a polymerizable group selected from a group having a carbon-carbon multiple bond, an epoxy group, and an oxetane group; and NRG represents a monomer unit having a vinyl group.

7. The organic electroluminescent element of claim 1, wherein the compound of formula (1) or (2) is present in the organic layer in an amount of 0.01% to 100% by weight.

8. An organic electroluminescent element comprising a pair of electrodes and at least one organic layer including a luminescent layer, the organic layer comprising at least one of:

a polymer compound represented by the formula (1) or the formula (2):

(1)

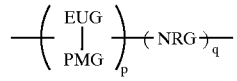

(2)

wherein EUG represents a monomer unit comprising a partial skeleton; PMG represents a monomer unit comprising a polymerizable group; NRG represents a copolymerization monomer unit; (EUG-PMG) represents a group wherein PMG is bonded as a single unit of EUG; and k, m, n, p and q each represents a mole percentage wherein k is from 1 to 99(%); m is from 1 to 99(%); n is from 0 to 98(%); k+m+n=100(%); p is from 1 to 99(%); q is from 0 to 99(%); and p+q=100(%); and a product obtained after a polymerization of the polymerizable group; and wherein the partial skeleton comprises a nitrogen-containing five-membered heteroaromatic compound comprising two or more heteroatoms.

9. An organic electroluminescent element comprising a pair of electrodes and at least one organic layer including a luminescent layer, the organic layer comprising at least one of:

a polymer compound represented by the formula (1) or the formula (2):

(1)

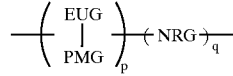

(2)

wherein EUG represents a monomer unit comprising a partial skeleton; PMG represents a monomer unit comprising a polymerizable group; NRG represents a copolymerization monomer unit; (EUG-PMG) represents a group wherein PMG is bonded as a single unit of EUG; and k, m, n, p and q each represents a mole percentage wherein k is from 1 to 99(%); mis from 1 to 99(%); n is from 0 to 98(%); k+m+n=100(%); p is from 1 to 99(%); q is from 0 to 99(%); and p+q=100(%); and a product obtained after a polymerization of the polymerizable group; and wherein the partial skeleton comprises a nitrogen-containing five-membered heteroaromatic compound comprising two or more heteroatoms and wherein the nitrogen-containing five-membered heteroaromatic compound is pyrazole, imidazole, oxazole, thiazole, triazole (1,2,3- and 1,2,4-), tetrazole, oxadiazole (1,2,4-, 1,2,5-and 1,3,4-), or thiadiazole (1,2,4-, 1,2,5- and 1,3,4-).

10. An organic electroluminescent element comprising a pair of electrodes and at least one organic layer including a luminescent layer, the organic layer comprising at least one of:

a polymer compound represented by the formula (1) or the formula (2):

(1)

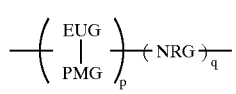

(2)

wherein EUG represents a monomer unit comprising a partial skeleton; PMG represents a monomer unit comprising a polymerizable group; NRG represents a copolymerization monomer unit; (EUG-PMG) represents a group wherein PMG is bonded as a single unit of EUG; and k, m, n, p and q each represents a mole percentage wherein k is from 1 to 99(%); m is from 1 to 99(%); n is from 0 to 98(%); k+m+n=100(%); p is from 1 to 99(%); q is from 0 to 99(%); and p+q=100(%); and a product obtained after a polymerization of the polymerizable group; and wherein the monomer unit of PMG is selected from monomer units represented by the formulae A-1 to A-15:

A-1

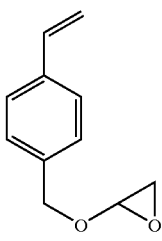

A-2

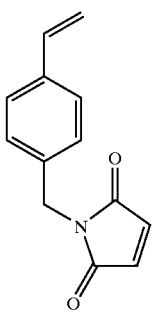

A-3

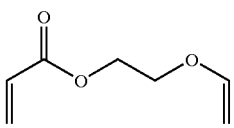

A-4

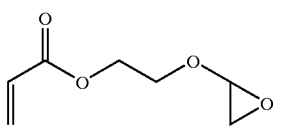

A-5

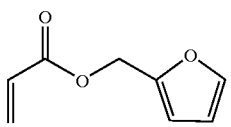

A-6

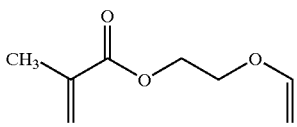

A-7

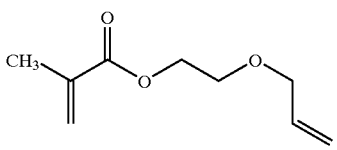

A-8

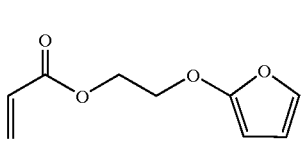

A-9

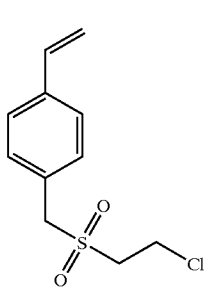

A-10

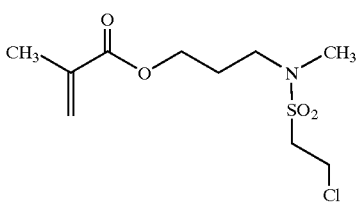

A-11

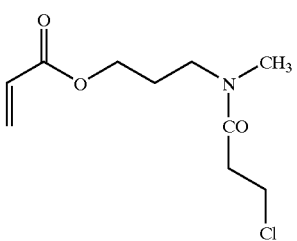

A-12

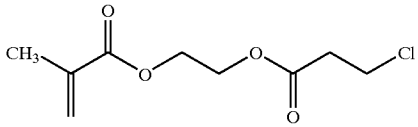

A-13
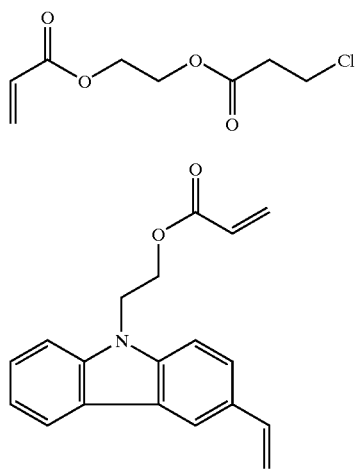
A-14
A-15
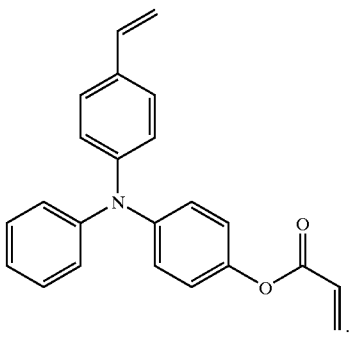
* * * * *